US011933825B2

(12) United States Patent
Mitsugi et al.

(10) Patent No.: US 11,933,825 B2
(45) Date of Patent: Mar. 19, 2024

(54) SYSTEM FREQUENCY DETECTOR

(71) Applicant: Toshiba Mitsubishi-Electric Industrial Systems Corporation, Tokyo (JP)

(72) Inventors: Yasuaki Mitsugi, Tokyo (JP); Takashi Shigemasa, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 638 days.

(21) Appl. No.: 16/973,437

(22) PCT Filed: Jan. 30, 2020

(86) PCT No.: PCT/JP2020/003524
§ 371 (c)(1),
(2) Date: Dec. 9, 2020

(87) PCT Pub. No.: WO2021/152789
PCT Pub. Date: Aug. 5, 2021

(65) Prior Publication Data
US 2021/0405098 A1 Dec. 30, 2021

(51) Int. Cl.
*G01R 23/06* (2006.01)
*G01R 23/15* (2006.01)

(52) U.S. Cl.
CPC ............ *G01R 23/06* (2013.01); *G01R 23/15* (2013.01)

(58) Field of Classification Search
CPC ........ G01R 23/06; G01R 23/15; G01R 23/12; G01R 23/02

(Continued)

(56) References Cited

U.S. PATENT DOCUMENTS 8,704,571 B2 4/2014 Kerkman et al.
9,696,355 B2 * 7/2017 Antonesei ............... H03L 7/093
(Continued)

FOREIGN PATENT DOCUMENTS

| JP | 3561119 B2 | 9/2004 |
|----|------------|--------|
| JP | 2012-163543 A | 8/2012 |
| WO | 2018/124221 A1 | 7/2018 |

OTHER PUBLICATIONS

Office Action dated Sep. 16, 2022, in corresponding Indian patent Application No. 202017053264, 6 pages.
(Continued)

*Primary Examiner* — Giovanni Astacio-Oquendo
(74) *Attorney, Agent, or Firm* — XSENSUS LLP

(57) ABSTRACT

A system frequency detector includes an orthogonal coordinate signal generator generating an orthogonal two-phase voltage signal from a three-phase voltage signal of three-phase alternating current power by converting the three-phase voltage signal into a two-phase voltage signal orthogonal to the three-phase voltage signal, converting the two-phase voltage signal into a voltage signal of a rotating coordinate system, calculating a moving average of the voltage signal of the rotating coordinate system, and performing an inverse transformation of the voltage signal of the rotating coordinate system after calculating the moving average. A frequency calculator calculates an angular frequency based on the two-phase voltage signal, and an arithmetic unit calculates a system frequency of the power system from the angular frequency. The frequency calculator includes a rate limiter in series with the arithmetic unit, the rate limiter limiting a change of the system frequency equal to or greater than a prescribed change rate.

20 Claims, 11 Drawing Sheets

(58) Field of Classification Search
USPC .................................. 324/76.41, 76.39, 76.11
See application file for complete search history.

(56) References Cited

U.S. PATENT DOCUMENTS

| | | | |
|---|---|---|---|
| 2013/0338954 A1* | 12/2013 | Seki ...................... | G01R 23/02 |
| | | | 702/75 |
| 2015/0204920 A1* | 7/2015 | Seki ................... | G01R 19/2513 |
| | | | 702/65 |
| 2016/0195574 A1* | 7/2016 | Virtala ................... | G01R 23/15 |
| | | | 702/64 |
| 2018/0059154 A1* | 3/2018 | Mecreant ................ | H02H 3/46 |
| 2019/0334352 A1 | 10/2019 | Sugimoto et al. | |
| 2022/0137110 A1* | 5/2022 | Mitsugi ................. | G01R 23/02 |
| | | | 324/76.39 |

OTHER PUBLICATIONS

International Search Report and Written Opinion dated Apr. 7, 2020, received for PCT Application No. PCT/JP2020/003524, Filed on Jan. 30, 2020, 8 pages.

\* cited by examiner

SYSTEM FREQUENCY DETECTOR

CROSS-REFERENCE TO RELATED APPLICATION

The present application is based on PCT filing PCT/JP2020/003524, filed Jan. 30, 2020, the entire contents of which are incorporated herein by reference.

TECHNICAL FIELD

Embodiments of the invention relate to a system frequency detector.

BACKGROUND ART

A zero crossing point detection-type frequency calculation is known as a technique of detecting a system frequency of a power system. The zero crossing point detection-type frequency calculation can take measurement data only in intervals synchronized with the system frequency; ordinarily, a filter of a relatively long time constant of 200 msec or more has been provided to acquire resistance to system disturbances. Therefore, for example, rapid output tracking for a change of the system frequency such as tracking with a delay of 40 msec or less, etc., is difficult.

Also, a frequency calculation using PLL (Phase Locked Loop) using a DQ transformation also is known. Such a frequency calculation using PLL can be used as a good frequency detector if there is no trouble at the power system side, and the system frequency can be tracked more quickly than the zero crossing point detection-type frequency calculation. However, there are cases where the calculated frequency temporarily oscillates greatly when a phase jump occurs in the system voltage.

Therefore, in a system frequency detector, it is desirable to be able to quickly track the change of the system frequency and to be able to suppress an erroneous detection of the system frequency even when a system disturbance occurs.

PRIOR ART DOCUMENTS

Patent Literature

[PTL 1]
U.S. Pat. No. 8,704,571

SUMMARY OF INVENTION

Problem to be Solved by the Invention

Embodiments of the invention provide a system frequency detector in which the change of the system frequency can be quickly tracked and an erroneous detection of the system frequency can be suppressed even when a system disturbance occurs.

Means for Solving the Problem

According to an embodiment of the invention, a system frequency detector is provided and includes: an orthogonal coordinate signal generator generating an orthogonal two-phase voltage signal from a three-phase voltage signal of three-phase alternating current power of a power system by converting the three-phase voltage signal into a two-phase voltage signal orthogonal to the three-phase voltage signal, converting the two-phase voltage signal into a voltage signal of a rotating coordinate system, calculating a moving average of the voltage signal of the rotating coordinate system, and performing an inverse transformation of the voltage signal of the rotating coordinate system after calculating the moving average; and a frequency calculator including an angular frequency calculator calculating an angular frequency of the power system based on the two-phase voltage signal after calculating the moving average generated by the orthogonal coordinate signal generator, and an arithmetic unit calculating a system frequency of the power system from the angular frequency by multiplying the angular frequency by $1/2\pi$, wherein the frequency calculator further includes a rate limiter that is provided in series with the arithmetic unit and limits a change of the system frequency equal to or greater than a prescribed change rate.

Effects of the Invention

According to embodiments of the invention, a system frequency detector is provided in which the change of the system frequency can be quickly tracked and an erroneous detection of the system frequency can be suppressed even when a system disturbance occurs.

MODES FOR CARRYING OUT THE INVENTION

Figure 1:
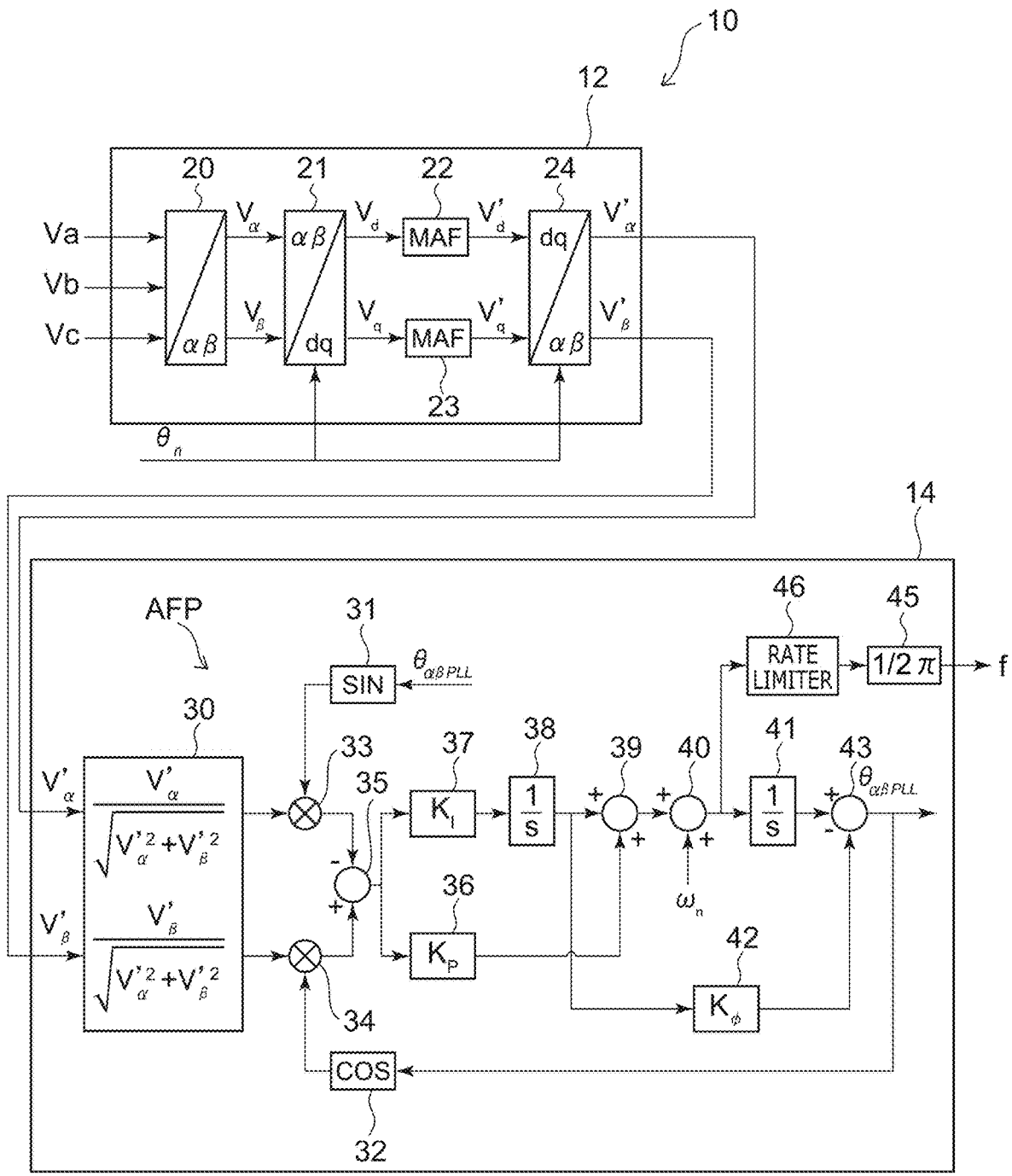
FIG. 1 is a block diagram schematically illustrating a system frequency detector according to a first embodiment.

Embodiments will now be described with reference to the drawings.

The drawings are schematic and conceptual; and the relationships between the thicknesses and widths of portions, the proportions of sizes among portions, etc., are not necessarily the same as the actual values. The dimensions and/or the proportions may be illustrated differently among drawings even in the case where the same portion is illustrated.

In the specification and drawings, components similar to those described previously or illustrated in an antecedent drawing are marked with the same reference numerals; and a detailed description is omitted as appropriate.

First Embodiment

FIG. 1 is a block diagram schematically illustrating a system frequency detector according to a first embodiment.

As illustrated in FIG. 1, the system frequency detector 10 includes an orthogonal coordinate signal generator 12 and a frequency calculator 14. The system frequency detector 10 detects the system frequency of a power system of three-phase alternating current power.

For example, the system frequency detector 10 is used in a power conversion device in which a distributed power source such as solar power generation, wind power generation, or the like is connected to a power system, etc. However, applications of the system frequency detector 10 are not limited thereto. The system frequency detector 10 can be used in any device in which it is necessary to detect the system frequency of a power system of three-phase alternating current power.

The orthogonal coordinate signal generator 12 generates orthogonal two-phase voltage signals $V_\alpha'$ and $V_\beta'$ from three-phase voltage signals $V_a$, $V_b$, and $V_c$ of the three-phase alternating current power of the power system. For example, the three-phase voltage signals $V_a$, $V_b$, and $V_c$ are detected by a voltage detector or the like and are input to the orthogonal coordinate signal generator 12. For example, the three-phase voltage signals $V_a$, $V_b$, and $V_c$ are instantaneous values of a three-phase alternating current voltage input at a prescribed sampling interval.

The orthogonal coordinate signal generator 12 includes a three-phase to two-phase converter 20, a rotating coordinate converter 21, moving average filters 22 and 23, and an inverse converter 24.

The three-phase to two-phase converter 20 converts the three-phase voltage signals $V_a$, $V_b$, and $V_c$ into two-phase voltage signals $V_\alpha$ and $V_\beta$ of an α-phase and a β-phase by performing an α-β transform (a Clarke transformation).

The two-phase voltage signals $V_\alpha$ and $V_\beta$ are input to the rotating coordinate converter 21, and a nominal phase $\theta_n$ obtained by integrating a nominal angular frequency $\omega_n$ of the power system is input to the rotating coordinate converter 21.

The rotating coordinate converter 21 performs a rotating coordinate transformation of the voltage signals $V_\alpha$ and $V_\beta$ of the orthogonal two-axis coordinates into voltage signals $V_d$ and $V_q$ of a coordinate system (dq coordinates) synchronized with the phase $\theta_n$ by a so-called dq transformation (a Park transformation). The voltage signal $V_d$ is a voltage signal of the d-axis component of the three-phase alternating current power (the voltage signals $V_a$, $V_b$, and $V_c$) of the power system, and the voltage signal $V_q$ is a voltage signal of the q-axis component of the three-phase alternating current power (the voltage signals $V_a$, $V_b$, and $V_c$) of the power system.

The moving average filter 22 outputs a voltage signal $V_d'$ after the moving average calculation by calculating the moving average of the voltage signal $V_d$. Similarly, the moving average filter 23 outputs a voltage signal $V_q'$ after the moving average calculation by calculating the moving average of the voltage signal $V_q$. Thus, the moving average filters 22 and 23 suppress the high frequency components of the voltage signals $V_d$ and $V_q$ by calculating the moving averages of the voltage signals $V_d$ and $V_q$. For example, the moving average filters 22 and 23 suppress the harmonic components included in the voltage signals $V_d$ and $V_q$. Thereby, for example, the undesirable effects on the detection of the system frequency due to trouble at the power system side such as voltage imbalance of the three phases, harmonics, noise, etc., can be suppressed.

By performing an inverse transformation of the voltage signal $V_d'$ and $V_q'$ of the rotating coordinate system into an orthogonal two-axis coordinate system, the inverse converter 24 converts the voltage signal $V_d'$ and $V_q'$ into the voltage signals $V_\alpha'$ and $V_\beta'$ of the orthogonal two-axis coordinates after the moving average calculation. Thereby, the orthogonal coordinate signal generator 12 generates the orthogonal two-phase voltage signals $V_\alpha'$ and $V_\beta'$ from the three-phase voltage signals $V_a$, $V_b$, and $V_c$.

The frequency calculator 14 calculates a system frequency f of the power system based on the two-phase voltage signals $V_\alpha'$ and $V_\beta'$ generated by the orthogonal coordinate signal generator 12. By using a PLL (Phase-Locked-Loop) calculation, the frequency calculator 14 detects a synchronous phase $\theta_{\alpha\beta PLL}$ synchronized with the voltage signals $V_\alpha'$ and $V_\beta'$ after the two-phase conversion and calculates the system frequency f of the power system from an angular frequency ω obtained in the detection process of the synchronous phase $\theta_{\alpha\beta PLL}$.

The frequency calculator 14 includes an angular frequency calculator AFP. The angular frequency calculator AFP includes, for example, arithmetic units 30, 31, and 32, multipliers 33 and 34, a subtractor 35, arithmetic units 36 and 37, an integrator 38, adders 39 and 40, an integrator 41, an arithmetic unit 42, and a subtractor 43.

The arithmetic unit 30 calculates $\cos\theta_n$ and $\sin\theta_n$ from the two-phase voltage signals $V_\alpha'$ and $V_\beta'$. The arithmetic unit 30 calculates $\cos\theta_n$ by using the formula $V_\alpha'/\sqrt{(V_\alpha'^2+V_\beta'^2)}$, and calculates $\sin\theta_n$ by using the formula $V_\beta'/\sqrt{(V_\alpha'^2+V_\beta'^2)}$. The arithmetic unit 30 inputs the calculated $\cos\theta_n$ to the multiplier 33, and inputs the calculated $\sin\theta_n$ to the multiplier 34.

The arithmetic unit 31 calculates $\sin\theta_{\alpha\beta PLL}$ based on the detected synchronous phase $\theta_{\alpha\beta PLL}$ and inputs $\sin\theta_{\alpha\beta PLL}$ to the multiplier 33.

The arithmetic unit 32 calculates $\cos\theta_{\alpha\beta PLL}$ based on the detected synchronous phase $\theta_{\alpha\beta PLL}$ and inputs $\cos\theta_{\alpha\beta PLL}$ to the multiplier 34.

The multiplier 33 multiplies the input $\cos\theta_n$ and $\sin\theta_{\alpha\beta PLL}$ and inputs the multiplication result to the subtractor 35.

The multiplier 34 multiplies the input $\sin\theta_n$ and $\cos\theta_{\alpha\beta PLL}$ and inputs the multiplication result to the subtractor 35.

The subtractor 35 calculates an error phase Δθ between the phase $\theta_n$ of the power system and the synchronous phase $\theta_{\alpha\beta PLL}$ by calculating $\sin\theta_n$ and $\cos\theta_{\alpha\beta PLL}-\cos\theta_n$ and $\sin\theta_{\alpha\beta PLL}$. The frequency calculator 14 calculates the error phase Δθ as $$\Delta\theta = \theta_n - \theta_{\alpha\beta PLL} \approx \sin\theta_n \text{ and } \cos\theta_{\alpha\beta PLL} - \cos\theta_n \text{ and } \sin\theta_{\alpha\beta PLL}$$

The arithmetic unit 36 multiplies the error phase Δθ by a proportional gain $K_P$ and inputs the multiplication result to the adder 39.

The arithmetic unit 37 multiplies the error phase Δθ by an integral gain $K_I$ and inputs the multiplication result to the integrator 38.

The integrator 38 integrates the multiplication result of the error phase Δθ and the integral gain $K_I$ and inputs the integral to the adder 39.

The adder 39 adds the multiplication result of the arithmetic unit 36 and the integral of the integrator 38. The arithmetic units 36 and 37, the integrator 38, and the adder 39 calculate a command value $\Delta\omega$ of the angular frequency for setting the error phase $\Delta\theta$ to zero by so-called proportional-integral control.

The command value $\Delta\omega$ of the angular frequency calculated by the adder 39 is input to the adder 40, and the nominal angular frequency $\omega_n$ of the power system is input to the adder 40. The adder 40 calculates the angular frequency $\omega$ of the power system by adding the command value $\Delta\omega$ of the angular frequency and the nominal angular frequency $\omega_n$ of the power system. Thus, the angular frequency calculator AFP calculates the angular frequency $\omega$ by performing the proportional-integral control based on the two-phase voltage signals $V_\alpha'$ and $V_\beta'$.

The integrator 41 calculates a synchronous phase $\theta$ from the angular frequency $\omega$ by integrating the angular frequency $\omega$ calculated by the adder 40. The integrator 41 inputs the calculated synchronous phase $\theta$ to the subtractor 43.

The arithmetic unit 42 calculates a correction value by multiplying the integration result of the integrator 38 by a constant $K_\phi$. The constant $K_\phi$ is determined by $K_\phi=(T_\omega-T_{SP})/2$. $T_{SP}$ is the sampling interval of the voltage signals $V_a$, $V_b$, and $V_c$. $T_\omega$ is the window length of the moving average filters 22 and 23. $T_\omega$ is represented by $N \cdot T_{SP}$, where N is the averaging number of the moving average filters 22 and 23. The arithmetic unit 42 inputs the calculated correction value to the subtractor 43.

The subtractor 43 corrects the synchronous phase $\theta$ by subtracting the correction value from the synchronous phase $\theta$. The subtractor 43 calculates the synchronous phase $\theta_{\alpha\beta PLL}$ by the correction.

The angular frequency calculator AFP synchronizes the synchronous phase $\theta_{\alpha\beta PLL}$ with the phase $\theta_n$ of the power system by feeding back the detected synchronous phase $\theta_{\alpha\beta PLL}$ to the arithmetic units 31 and 32. Thus, based on the angular frequency $\omega$, the angular frequency calculator AFP detects the synchronous phase $\theta_{\alpha\beta PLL}$ synchronized with the two-phase voltage signals $V_\alpha'$ and $V_\beta'$ after calculating the moving averages, calculates the error phase $\Delta\theta$ between the nominal phase $\theta_n$ of the power system and the synchronous phase $\theta_{\alpha\beta PLL}$, and calculates the angular frequency $\omega$ to cause the error phase $\Delta\theta$ to be zero. For example, the configuration of the PLL of the angular frequency calculator AFP (the frequency calculator 14) of the example may be called $\alpha\beta$EPMAFPLL ($\alpha\beta$ Enhanced Pre-filtering Moving Average Filter PLL).

The frequency calculator 14 further includes an arithmetic unit 45 and a rate limiter 46. The frequency calculator 14 calculates the system frequency f of the power system from the calculated angular frequency $\omega$. The adder 40 inputs the calculated angular frequency $\omega$ to the integrator 41 and inputs the angular frequency $\omega$ to the rate limiter 46.

The rate limiter 46 limits a change of the angular frequency $\omega$ equal to or greater than a prescribed change rate. The rate limiter 46 inputs, to the arithmetic unit 45, the angular frequency $\omega$ that is less than the prescribed change rate or the angular frequency $\omega$ after being limited to the prescribed change rate.

The arithmetic unit 45 calculates the system frequency f from the angular frequency $\omega$ by multiplying the angular frequency $\omega$ by $1/2\pi$. The rate limiter 46 is provided in series with the arithmetic unit 45. By limiting a change of the angular frequency $\omega$ equal to or greater than the prescribed change rate, the rate limiter 46 limits a change of the system frequency f equal to or greater than a prescribed change rate. For example, the rate limiter 46 suppresses a change of the system frequency f equal to or greater than 25 Hz/sec. The rate limiter 46 suppresses an abrupt fluctuation of the system frequency f.

Thus, the frequency calculator 14 calculates the system frequency f of the power system from the two-phase voltage signals $V_\alpha'$ and $V_\beta'$. The system frequency detector 10 detects the system frequency f of the power system from the three-phase voltage signals $V_a$, $V_b$, and $V_c$.

As described above, the system frequency detector 10 according to the embodiment includes the rate limiter 46 that limits a change of the system frequency f equal to or greater than the prescribed change rate. Thereby, even when a phase jump or the like occurs in the power system, an abrupt fluctuation of the system frequency f can be suppressed, and the error of the calculation of the system frequency f can be reduced. Also, the calculation of the system frequency f is an open loop; therefore, effects on the speed of the system voltage phase tracking by PLL can be suppressed even when the rate limiter 46 is provided in the part calculating the system frequency f. Accordingly, the system frequency detector 10 can be provided in which the change of the system frequency f can be quickly tracked, and an erroneous detection of the system frequency f can be suppressed even when a system disturbance occurs.

Figure 2:
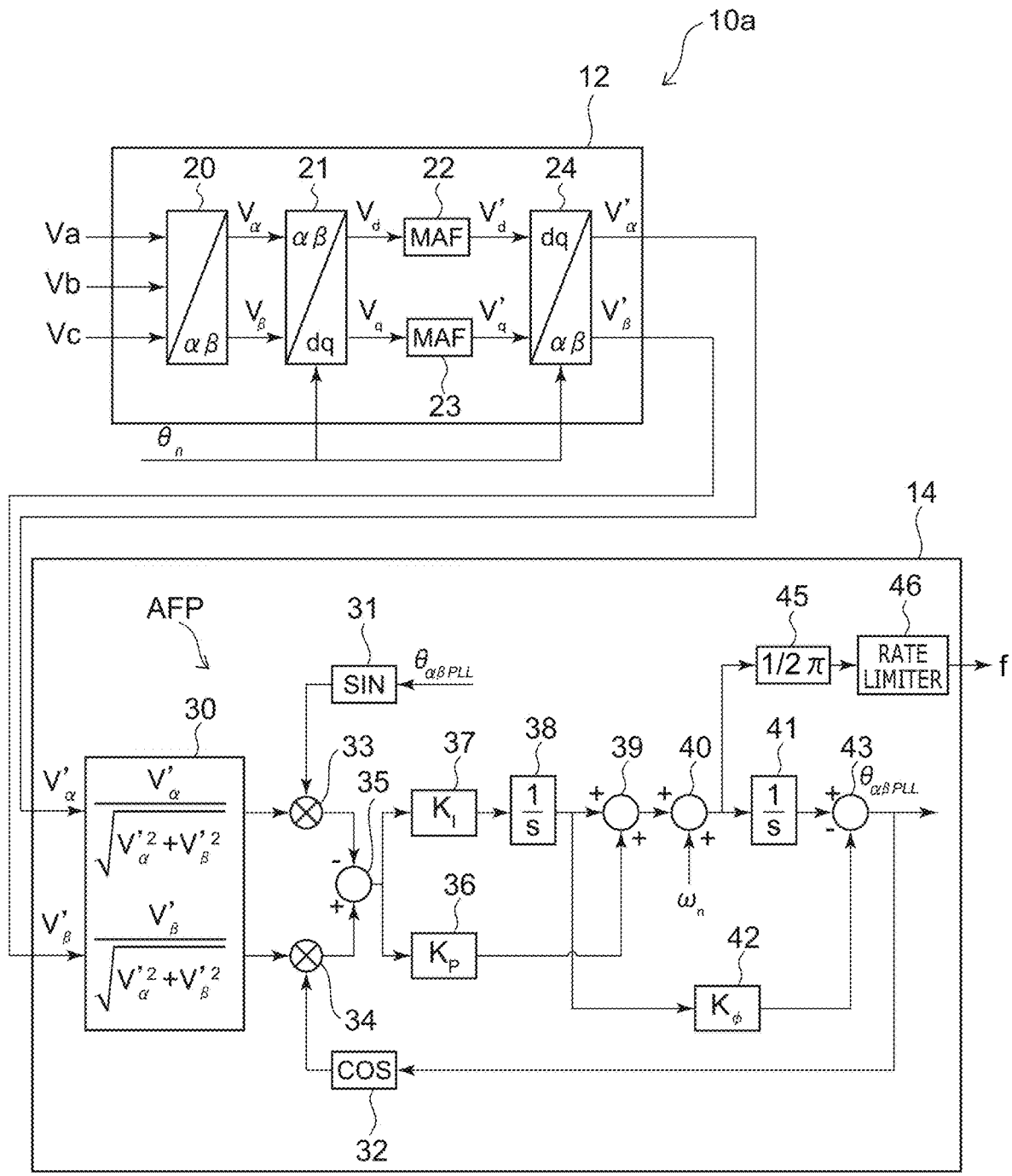
FIG. 2 is a block diagram schematically illustrating a modification of the system frequency detector according to the first embodiment.

FIG. 2 is a block diagram schematically illustrating a modification of the system frequency detector according to the first embodiment.

Components that are substantially the same functionally and configurationally as those of the embodiments described above are marked with the same reference numerals, and a detailed description is omitted.

In the system frequency detector 10a as illustrated in FIG. 2, the rate limiter 46 is provided after the arithmetic unit 45 that multiplies $1/2\pi$. Thus, the rate limiter 46 may directly limit a change of the system frequency f equal to or greater than the prescribed change rate after being converted from the angular frequency $\omega$.

Thus, the rate limiter 46 may be provided before the arithmetic unit 45 or may be provided after the arithmetic unit 45. The rate limiter 46 may limit a change of the system frequency f equal to or greater than the prescribed change rate by limiting a change of the angular frequency $\omega$ equal to or greater than the prescribed change rate or may directly limit a change of the system frequency f equal to or greater than the prescribed change rate. The configuration of the rate limiter 46 may be any configuration in which the rate limiter 46 is provided in series with the arithmetic unit 45 and can limit a change of the system frequency f equal to or greater than the prescribed change rate.

Second Embodiment

Figure 3:
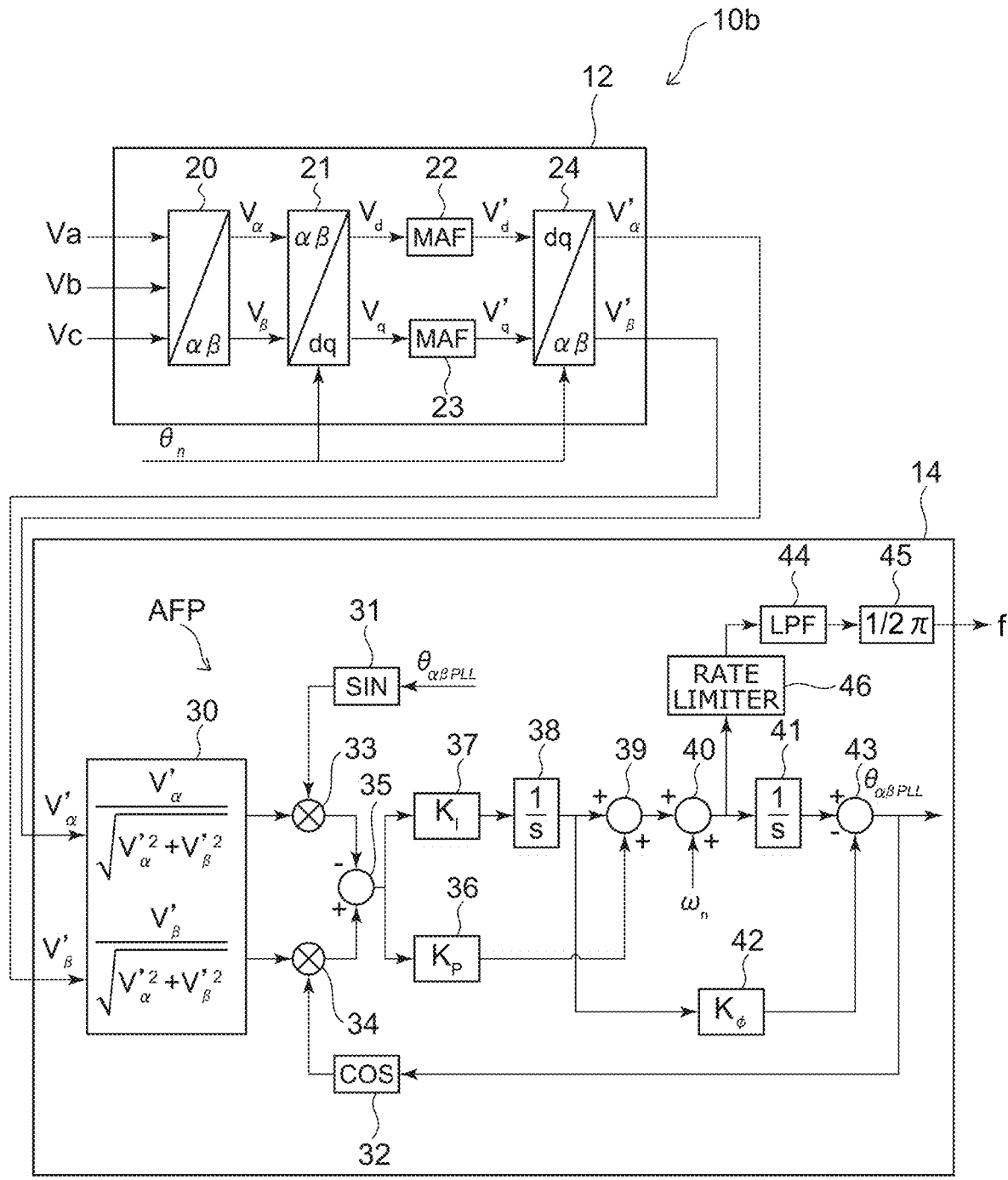
FIG. 3 is a block diagram schematically illustrating a system frequency detector according to a second embodiment.

FIG. 3 is a block diagram schematically illustrating a system frequency detector according to a second embodiment.

In the system frequency detector 10b as illustrated in FIG. 3, the frequency calculator 14 further includes a low-pass filter 44. The low-pass filter 44 is provided in series with the arithmetic unit 45. For example, the low-pass filter 44 is provided between the arithmetic unit 45 and the rate limiter 46.

The low-pass filter 44 suppresses the high frequency components of the angular frequency $\omega$. The low-pass filter 44 attenuates frequency components of the angular frequency $\omega$ that are greater than a prescribed frequency. In other words, the low-pass filter 44 suppresses an abrupt fluctuation of the angular frequency ω. For example, the low-pass filter 44 may use a moving average filter. The low-pass filter 44 inputs, to the arithmetic unit 45, the angular frequency ω after the high frequency components are suppressed.

The low-pass filter 44 is provided in series with the arithmetic unit 45. The low-pass filter 44 suppresses the high frequency components of the system frequency f by suppressing the high frequency components of the angular frequency ω. The low-pass filter 44 suppresses an abrupt fluctuation of the system frequency f.

Thus, by providing the low-pass filter 44, even when a phase jump or the like occurs in the power system, an abrupt fluctuation of the system frequency f can be suppressed, and the error of the calculation of the system frequency f can be reduced further.

The low-pass filter 44 is not limited to being between the arithmetic unit 45 and the rate limiter 46, and may be provided before the rate limiter 46 or may be provided after the arithmetic unit 45. The configuration of the low-pass filter 44 may be any configuration in which the low-pass filter 44 is provided in series with the arithmetic unit 45 and can suppress the high frequency components of the system frequency f.

Third Embodiment

Figure 4:
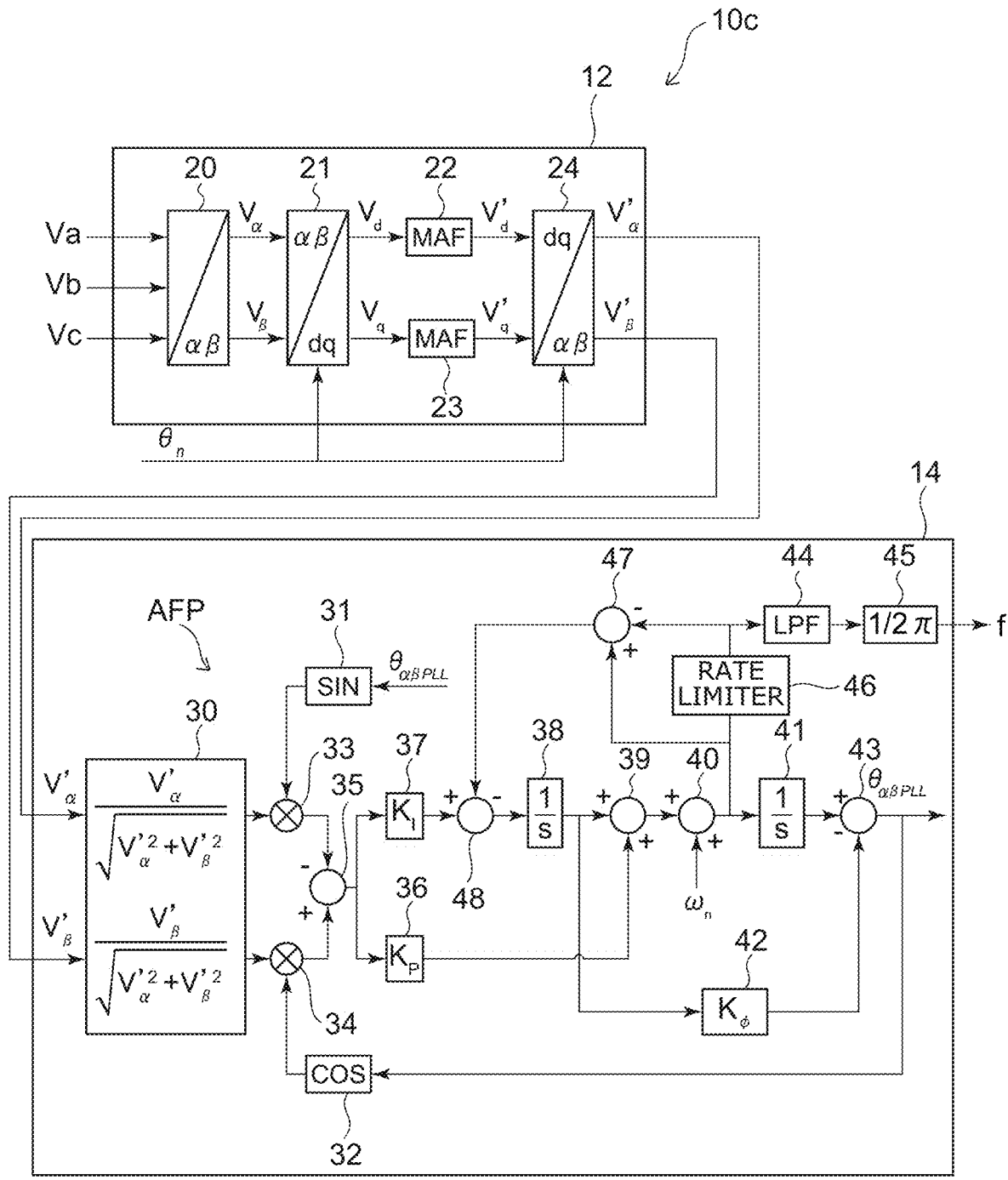
FIG. 4 is a block diagram schematically illustrating a system frequency detector according to a third embodiment.

FIG. 4 is a block diagram schematically illustrating a system frequency detector according to a third embodiment.

In the system frequency detector 10c as illustrated in FIG. 4, the frequency calculator 14 further includes subtractors 47 and 48. The subtractor 47 is connected to the input and output sides of the rate limiter 46. The subtractor 47 subtracts the output value of the rate limiter 46 from the input value of the rate limiter 46. In other words, the subtractor 47 calculates the difference between the input value and the output value of the rate limiter 46. The difference between the output value of the rate limiter 46 and the input value of the rate limiter 46 is calculated by the subtractor 47 when the calculated value of the angular frequency ω abruptly increases, the angular frequency ω is limited by the rate limiter 46, and the output value of the rate limiter 46 becomes less than the input value of the rate limiter 46. The subtractor 47 inputs the calculation result of the difference to the subtractor 48.

The subtractor 48 is provided between the arithmetic unit 37 and the integrator 38 of the angular frequency calculator AFP. The subtractor 48 subtracts the calculation result of the difference of the subtractor 47 from the multiplication result of the arithmetic unit 37 multiplying the error phase Δθ by the integral gain Kr. In other words, when the rate limiter 46 limits the angular frequency ω, the subtractor 48 subtracts the amount limited by the rate limiter 46 from the calculation of the integration operation of the proportional-integral control.

Thus, in the frequency calculator 14 of the system frequency detector 10c, the subtractors 47 and 48 are provided and feed back the output-input difference of the rate limiter 46 to the calculation of the proportional-integral control of the angular frequency calculator AFP. Thereby, even when a phase jump or the like occurs in the power system, an abrupt fluctuation of the system frequency f can be more reliably suppressed, and the error of the calculation of the system frequency f can be reduced further. For example, such a control of the feedback may be called Anti reset wind up.

Fourth Embodiment

Figure 5:
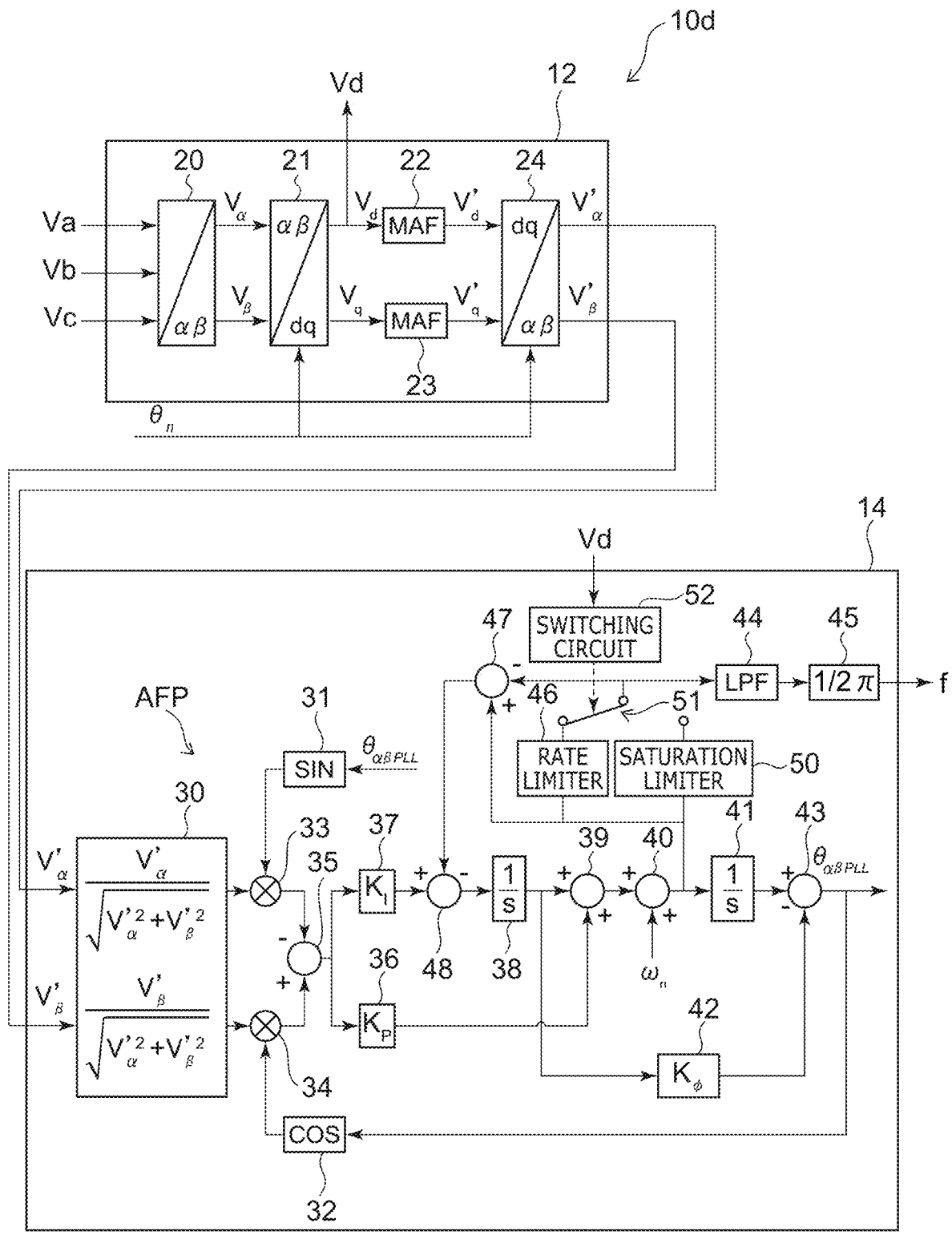
FIG. 5 is a block diagram schematically illustrating a system frequency detector according to a fourth embodiment.

FIG. 5 is a block diagram schematically illustrating a system frequency detector according to a fourth embodiment.

In the system frequency detector 10d as illustrated in FIG. 5, the frequency calculator 14 further includes a saturation limiter 50, a switching element 51, and a switching circuit 52.

The saturation limiter 50 is provided in parallel with the rate limiter 46. In the example, the rate limiter 46 is provided between the adder 40 and the low-pass filter 44; similarly to the rate limiter 46, the saturation limiter 50 also is provided between the adder 40 and the low-pass filter 44. For example, when the rate limiter 46 is provided between the low-pass filter 44 and the arithmetic unit 45, it is sufficient for the saturation limiter 50 also to be similarly provided between the low-pass filter 44 and the arithmetic unit 45.

The switching element 51 is provided between the rate limiter 46 and the arithmetic unit 45 (the low-pass filter 44) and between the saturation limiter 50 and the arithmetic unit 45 (the low-pass filter 44). The switching element 51 selectively switches between a state in which the rate limiter 46 is connected in series to the arithmetic unit 45 and a state in which the saturation limiter 50 is connected in series to the arithmetic unit 45.

In the state in which the switching element 51 connects the rate limiter 46 to the arithmetic unit 45 in series, the subtractor 47 is connected to the input and output sides of the rate limiter 46. Accordingly, in this state, the output-input difference of the rate limiter 46 is fed back to the calculation of the proportional-integral control.

On the other hand, in the state in which the switching element 51 connects the saturation limiter 50 to the arithmetic unit 45 in series, the subtractor 47 is connected to the input and output sides of the saturation limiter 50. Accordingly, in this state, the output-input difference of the saturation limiter 50 is fed back to the calculation of the proportional-integral control.

The saturation limiter 50 limits a change of the system frequency f equal to or greater than a prescribed value with respect to the nominal system frequency $f_n$ by limiting a change of the angular frequency ω equal to or greater than a prescribed value with respect to the nominal angular frequency $ω_n$. The prescribed value (the prescribed absolute value) is, for example, 0.5 Hz. For example, when the nominal system frequency $f_n$ is 50 Hz, the saturation limiter 50 limits the change of the system frequency f to be within the range of 50 Hz±0.5 Hz.

As described above, for example, the rate limiter 46 suppresses a change of the system frequency f equal to or greater than 25 Hz/sec. Thus, the prescribed value (e.g., 0.5 Hz) of the change of the system frequency f limited by the saturation limiter 50 is, for example, less than the frequency (e.g., 25 Hz) of the change rate per unit time (1 second) of the rate limiter 46.

The switching circuit 52 selectively switches between the first state in which the rate limiter 46 is used and the second state in which the saturation limiter 50 is used. For example, the switching circuit 52 selectively switches between the first state and the second state by controlling the switching of the paths by the switching element 51.

However, the switching between the first state and the second state is not limited thereto. For example, the first state and the second state may be switched by selectively operating the rate limiter 46 and the saturation limiter 50 by selectively supplying power to the rate limiter 46 and the saturation limiter 50, or the first state and the second state may be switched by selectively operating the rate limiter 46 and the saturation limiter 50 by selectively transmitting control signals to the rate limiter 46 and the saturation limiter 50. The switching element 51 is omissible in such cases. It is sufficient for the switching element 51 to be provided as necessary.

Figure 6:
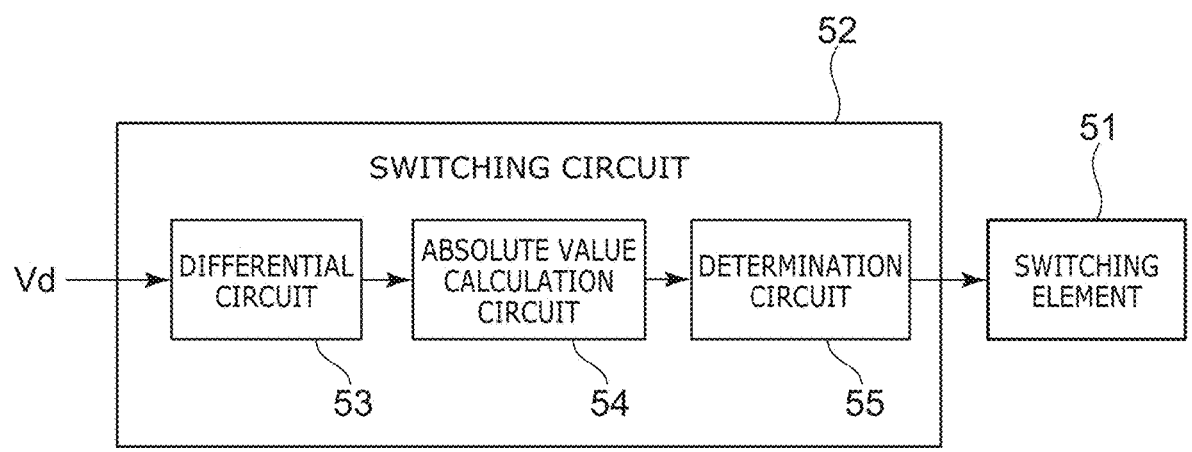
FIG. 6 is a block diagram schematically illustrating the switching circuit.

FIG. 6 is a block diagram schematically illustrating the switching circuit.

As illustrated in FIG. 6, the switching circuit 52 includes a differential circuit 53, an absolute value calculation circuit 54, and a determination circuit 55. The voltage signal $V_d$ that is calculated by the rotating coordinate converter 21 is input to the switching circuit 52.

The differential circuit 53 calculates a differential of the voltage signal $V_d$. In other words, the differential circuit 53 calculates the slope of the voltage signal $V_d$. The absolute value calculation circuit 54 calculates the absolute value of the differential of the voltage signal $V_d$ calculated by the differential circuit 53.

The determination circuit 55 determines whether or not the absolute value of the differential of the voltage signal $V_d$ is equal to or greater than a prescribed value. When a phase jump occurs in the power system, the voltage signal $V_d$ of the d-axis component of the three-phase alternating current power of the power system abruptly changes (referring to FIG. 7D). Therefore, when the absolute value of the differential of the voltage signal $V_d$ is equal to or greater than the prescribed value, it can be considered that a phase jump has occurred in the power system.

The determination circuit 55 switches the path of the switching element 51. When the absolute value of the differential of the voltage signal $V_d$ is less than the prescribed value, the determination circuit 55 sets the switching element 51 to a state in which the output of the rate limiter 46 is connected to the low-pass filter 44. In other words, the determination circuit 55 selects the first state in which the rate limiter 46 is used when it is determined that a phase jump has not occurred in the power system.

On the other hand, when the absolute value of the differential of the voltage signal $V_d$ is equal to or greater than the prescribed value, the determination circuit 55 sets the switching element 51 to a state in which the output of the saturation limiter 50 is connected to the low-pass filter 44. In other words, the determination circuit 55 selects the second state in which the saturation limiter 50 is used when it is determined that a phase jump has occurred in the power system.

Thus, the switching circuit 52 selects the first state when the absolute value of the differential of the voltage signal $V_d$ of the active component is less than the prescribed value, and selects the second state when the absolute value of the differential of the voltage signal $V_d$ of the active component is equal to or greater than the prescribed value.

When switching from the first state to the second state, for example, the determination circuit 55 returns the second state to the first state after a prescribed period of time has elapsed from the timing of the switching from the first state to the second state. For example, after switching from the first state to the second state, the determination circuit 55 may return the second state to the first state by responding to the absolute value of the differential of the voltage signal $V_d$ returning to be less than the prescribed value.

FIGS. 7A to 7G are graphs schematically illustrating an example of an operation of the system frequency detector.

In FIGS. 7A to 7G, the horizontal axis is time.

Figure 7A:
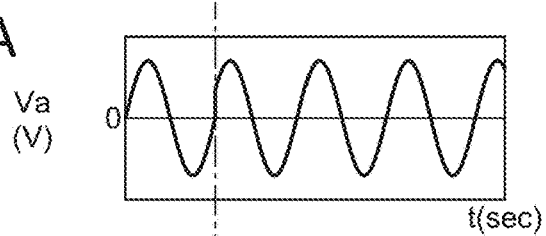
FIGS. 7A to 7G are graphs schematically illustrating an example of an operation of the system frequency detector.

The vertical axis of FIG. 7A is an example of the three-phase voltage signal $V_a$.

Figure 7B:
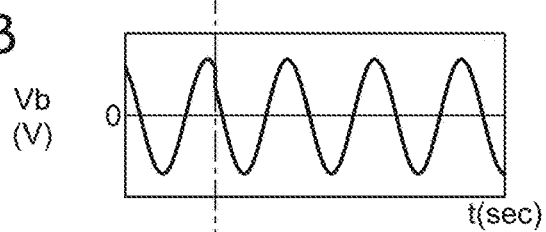

The vertical axis of FIG. 7B is an example of the three-phase voltage signal $V_b$.

Figure 7C:
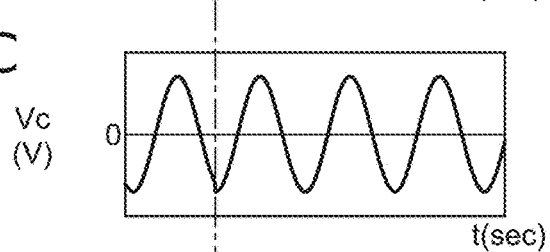

The vertical axis of FIG. 7C is an example of the three-phase voltage signal $V_c$.

Figure 7D:
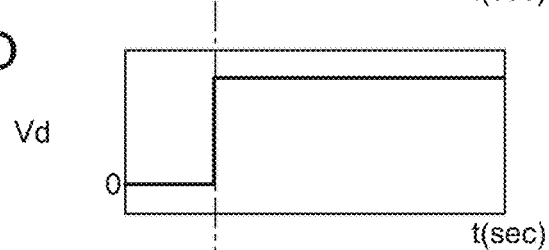

The vertical axis of FIG. 7D is an example of the voltage signal $V_d$ of the rotating coordinate system.

Figure 7E:
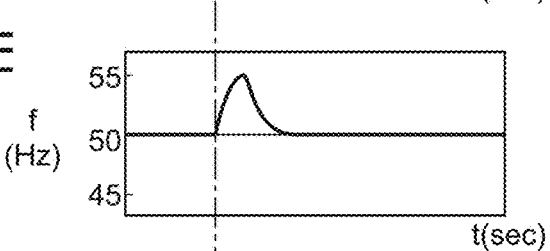

The vertical axis of FIG. 7E is an example of a reference system frequency f calculated by the arithmetic unit 45 from the angular frequency ω calculated by the adder 40 as-is without passing through the low-pass filter 44, etc.

Figure 7F:
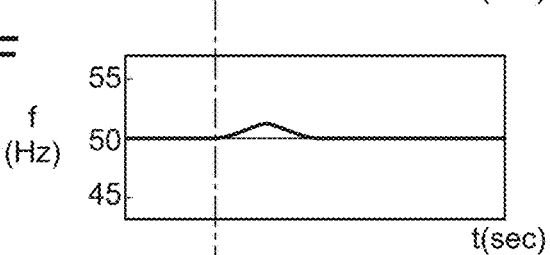

The vertical axis of FIG. 7F is an example of the system frequency f calculated by the configuration of the system frequency detector 10c.

Figure 7G:
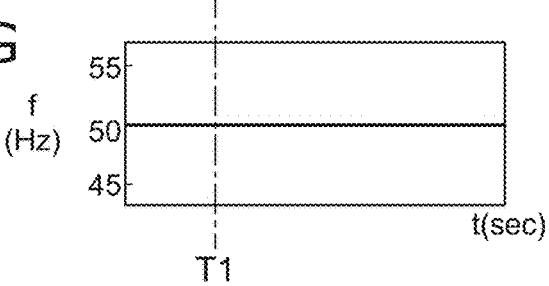

The vertical axis of FIG. 7G is an example of the system frequency f calculated by the configuration of the system frequency detector 10d.

FIGS. 7A to 7G illustrate an example when a phase jump of about 30 degrees occurs at a time T1. Also, the actual system frequency of the power system is set to 50 Hz in FIGS. 7A to 7G.

When a phase jump occurs as illustrated in FIG. 7D, the voltage signal $V_d$ of the d-axis component of the three-phase alternating current power of the power system abruptly changes.

As illustrated in FIG. 7E, when the system frequency f is calculated without using the low-pass filter 44, etc., a mismeasurement of about 5 Hz occurs when the phase jump occurs.

Conversely, as illustrated in FIG. 7F, in the system frequency detector 10c in which the output-input difference of the rate limiter 46 is fed back to the calculation of the proportional-integral control, the mismeasurement can be suppressed to about 1 Hz when the phase jump occurs.

Also, in the system frequency detector 10d that switches from the rate limiter 46 to the saturation limiter 50 when the occurrence of a phase jump is detected, the mismeasurement when the phase jump occurs can be suppressed further. In the system frequency detector 10d, the mismeasurement can be suppressed to about 0.01 Hz. In other words, in the system frequency detector 10d, the mismeasurement of the system frequency f when the phase jump occurs can be suppressed to the width of the limit of the saturation limiter 50.

Thereby, in the system frequency detector 10d, even when a phase jump or the like occurs in the power system, an abrupt fluctuation of the system frequency f can be more reliably suppressed, and the error of the calculation of the system frequency f can be reduced further.

Fifth Embodiment

Figure 8:
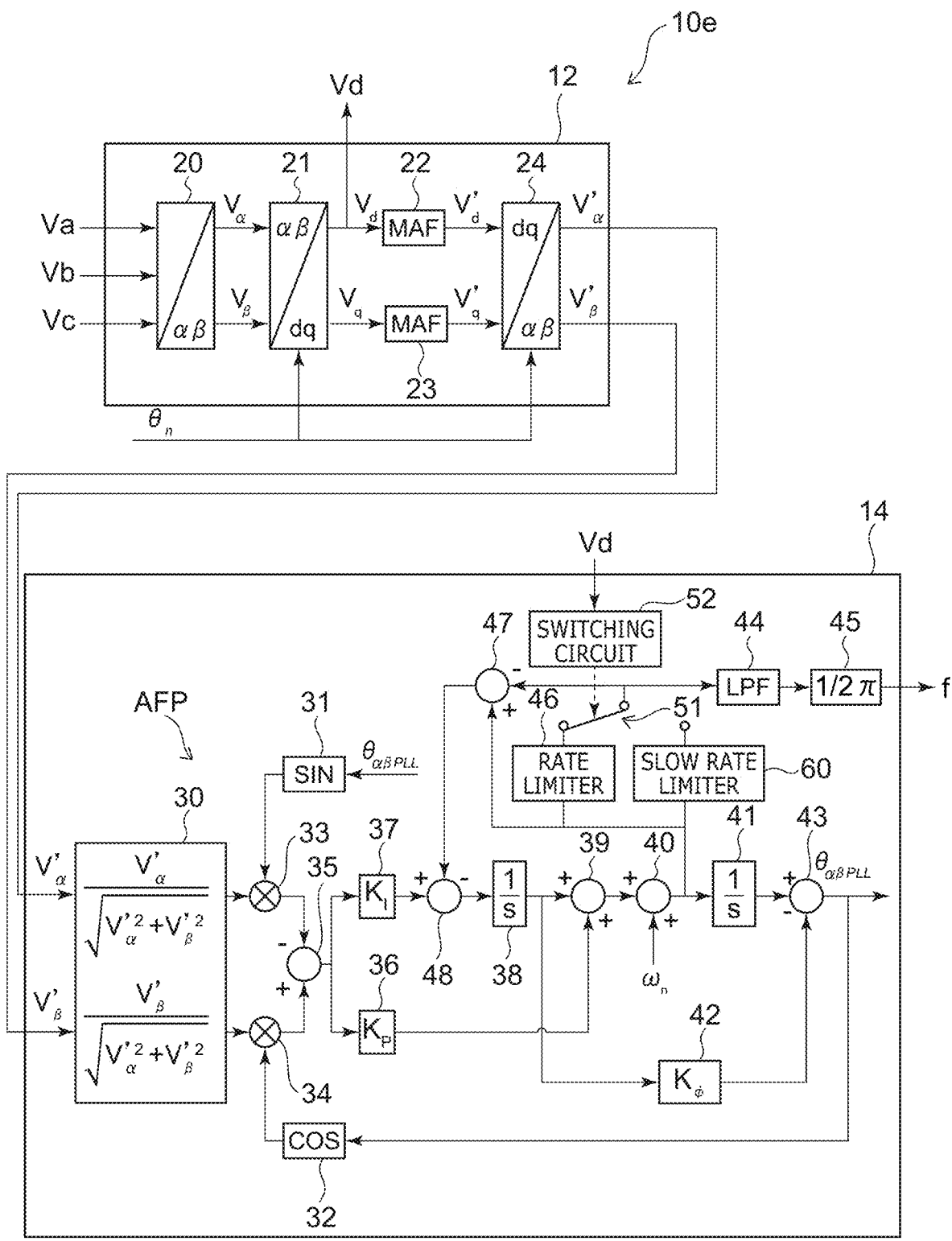
FIG. 8 is a block diagram schematically illustrating a system frequency detector according to a fifth embodiment.

FIG. 8 is a block diagram schematically illustrating a system frequency detector according to a fifth embodiment.

In the system frequency detector 10e as illustrated in FIG. 8, the saturation limiter 50 of the system frequency detector 10d is replaced with a slow rate limiter 60. The slow rate limiter 60 limits the change of the system frequency f at a lower change rate than the change rate of the rate limiter 46.

In the example, the switching circuit 52 selectively switches between the first state in which the rate limiter 46 is used and the second state in which the slow rate limiter 60 is used. Similarly to the embodiments described above, the switching circuit 52 selects the first state when the absolute value of the differential of the voltage signal $V_d$ of the active component is less than a prescribed value, and selects the second state when the absolute value of the differential of the voltage signal $V_d$ of the active component is equal to or greater than the prescribed value.

Thus, even when switching from the rate limiter 46 to the slow rate limiter 60 when the occurrence of a phase jump is detected, similarly to when the saturation limiter 50 is provided, the mismeasurement when the phase jump occurs can be suppressed further compared to the configuration of the system frequency detector 10c that feeds back the output-input difference of the rate limiter 46 to the calculation of the proportional-integral control.

Sixth Embodiment

Figure 9:
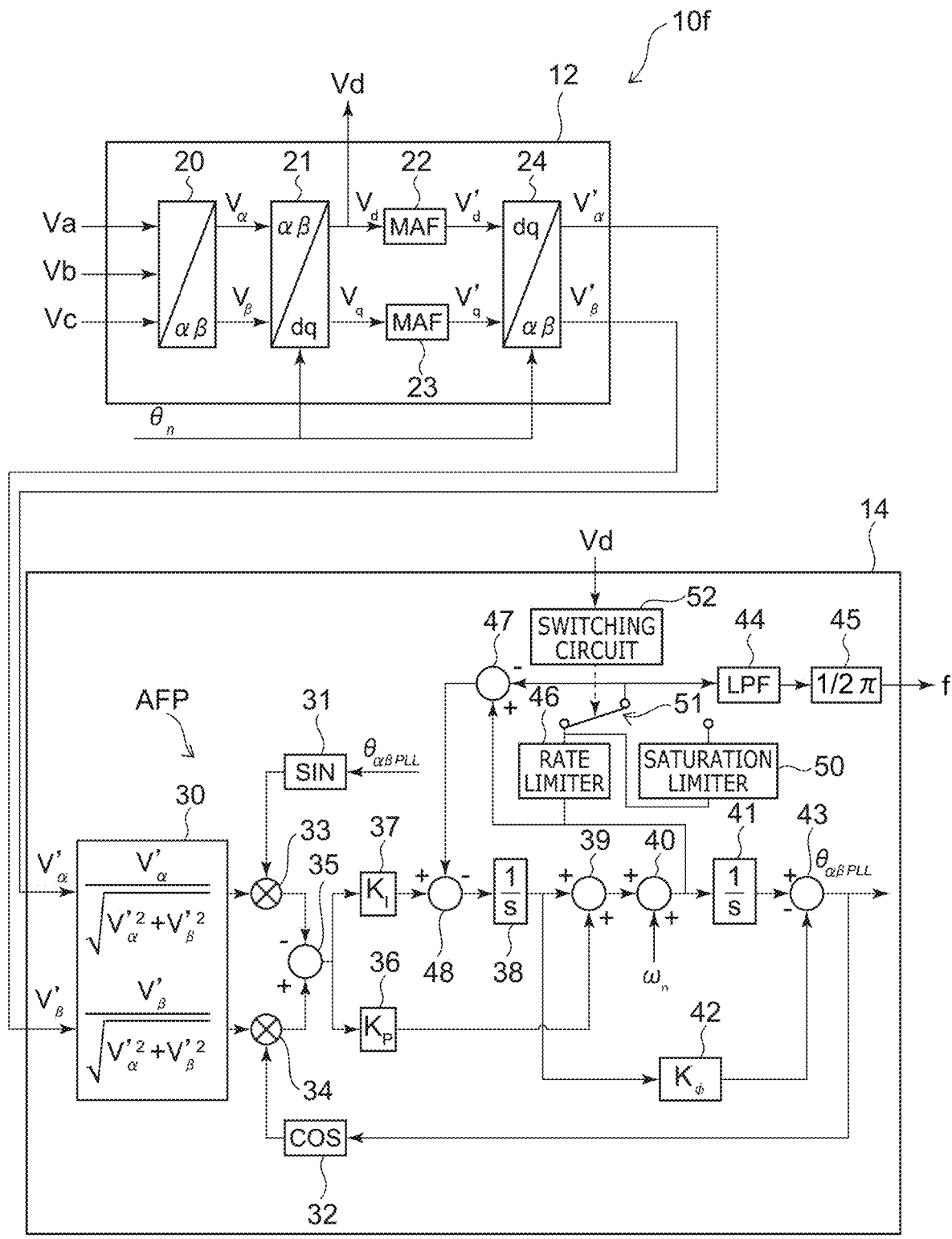
FIG. 9 is a block diagram schematically illustrating a system frequency detector according to a sixth embodiment.

FIG. 9 is a block diagram schematically illustrating a system frequency detector according to a sixth embodiment.

In the system frequency detector 10f as illustrated in FIG. 9, the saturation limiter 50 is provided in series with the rate limiter 46. Also, in the system frequency detector 10f, the switching element 51 selectively switches between a state in which only the rate limiter 46 is connected in series to the arithmetic unit 45, and a state in which the rate limiter 46, the saturation limiter 50, and the arithmetic unit 45 are connected in series.

In the state in which the switching element 51 connects only the rate limiter 46 to the arithmetic unit 45 in series, the subtractor 47 is connected to the input and output sides of the rate limiter 46. Accordingly, in this state, the output-input difference of the rate limiter 46 is fed back to the calculation of the proportional-integral control.

On the other hand, in the state in which the switching element 51 connects the rate limiter 46, the saturation limiter 50, and the arithmetic unit 45 in series, the subtractor 47 is connected to the input and output sides of a series-connected unit of the rate limiter 46 and the saturation limiter 50.

The switching circuit 52 selectively switches between the first state in which only the rate limiter 46 is used and the second state in which the series-connected unit of the rate limiter 46 and the saturation limiter 50 is used. For example, the switching circuit 52 selectively switches between the first state and the second state by controlling the switching of the paths by the switching element 51.

However, the switching between the first state and the second state is not limited thereto. For example, the first state may be set by operating only the rate limiter 46, and the second state may be set by operating the rate limiter 46 and the saturation limiter 50. In such a case, the switching element 51 is omissible.

Similarly to the embodiments described above, the switching circuit 52 selects the first state when the absolute value of the differential of the voltage signal $V_d$ of the active component is less than a prescribed value, and selects the second state when the absolute value of the differential of the voltage signal $V_d$ of the active component is equal to or greater than the prescribed value.

The frequency that is limited by the saturation limiter 50 is set to be less than the frequency limited by the rate limiter 46. Accordingly, in this state, substantially, the output of the saturation limiter 50 is used in the calculation of the system frequency f, and the output-input difference of the saturation limiter 50 is fed back to the calculation of the proportional-integral control. Therefore, effects similar to those of the system frequency detector 10d in which the saturation limiter 50 is provided in parallel with the rate limiter 46 can be obtained also in the system frequency detector 10f in which the saturation limiter 50 is provided in series with the rate limiter 46.

Instead of the saturation limiter 50, the slow rate limiter 60 may be provided in series with the rate limiter 46. In such a case, effects similar to those of the system frequency detector 10e can be obtained.

Seventh Embodiment

Figure 10:
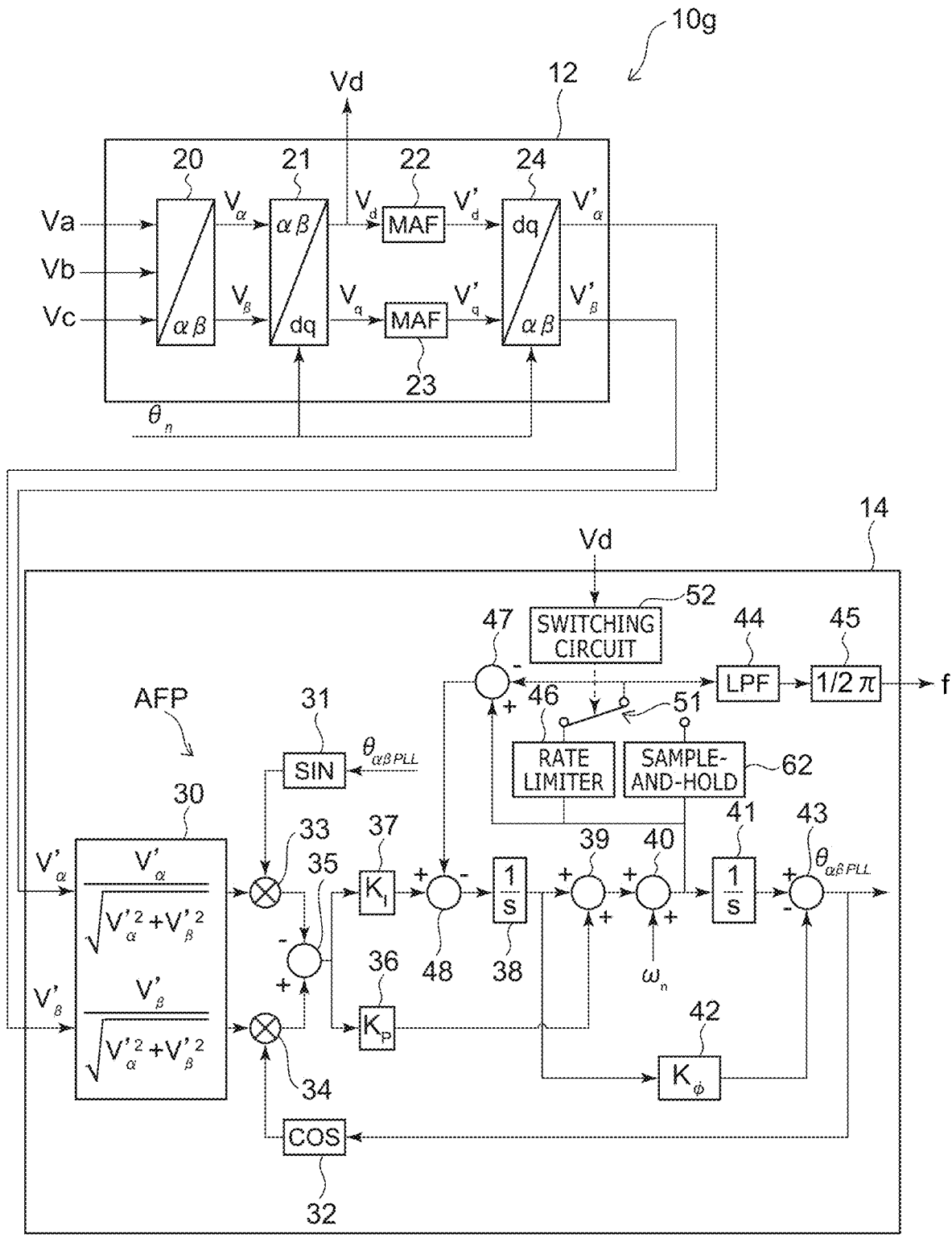
FIG. 10 is a block diagram schematically illustrating a system frequency detector according to a seventh embodiment.

FIG. 10 is a block diagram schematically illustrating a system frequency detector according to a seventh embodiment. In the system frequency detector 10g as illustrated in FIG. 10, the saturation limiter 50 of the system frequency detector 10d is replaced with a sample-and-hold circuit 62.

The sample-and-hold circuit 62 includes a sample mode in which the output signal is caused to track the input signal, and a hold mode in which the output signal is held to be substantially constant at a value of a prescribed timing.

The switching circuit 52 selectively switches between the first state in which the rate limiter 46 is used and the second state in which the sample-and-hold circuit 62 is used.

When the absolute value of the differential of the voltage signal $V_d$ is less than a prescribed value and it is determined that a phase jump has not occurred in the power system, the switching circuit 52 (the determination circuit 55) selects the first state in which the rate limiter 46 is used and operates the sample-and-hold circuit 62 in the sample mode.

When the absolute value of the differential of the voltage signal $V_d$ is equal to or greater than the prescribed value and it is determined that a phase jump has occurred in the power system, the switching circuit 52 (the determination circuit 55) selects the second state in which the sample-and-hold circuit 62 is used and switches the sample-and-hold circuit 62 from the sample mode to the hold mode. Thereby, the switching circuit 52 causes the sample-and-hold circuit 62 to maintain the signal (the angular frequency ω or the system frequency f) directly before the phase jump occurs in the power system.

Thus, even when switching from the rate limiter 46 to the sample-and-hold circuit 62 when the occurrence of a phase jump is detected, similarly to when the saturation limiter 50 is provided, the mismeasurement when the phase jump occurs can be suppressed further compared to the configuration of the system frequency detector 10c in which the output-input difference of the rate limiter 46 is fed back to the calculation of the proportional-integral control.

As described above, the mismeasurement of the system frequency f due to the occurrence of the phase jump can be more reliably suppressed by causing the sample-and-hold circuit 62 to maintain the signal directly before the phase jump occurs in the power system.

Eighth Embodiment

Figure 11:
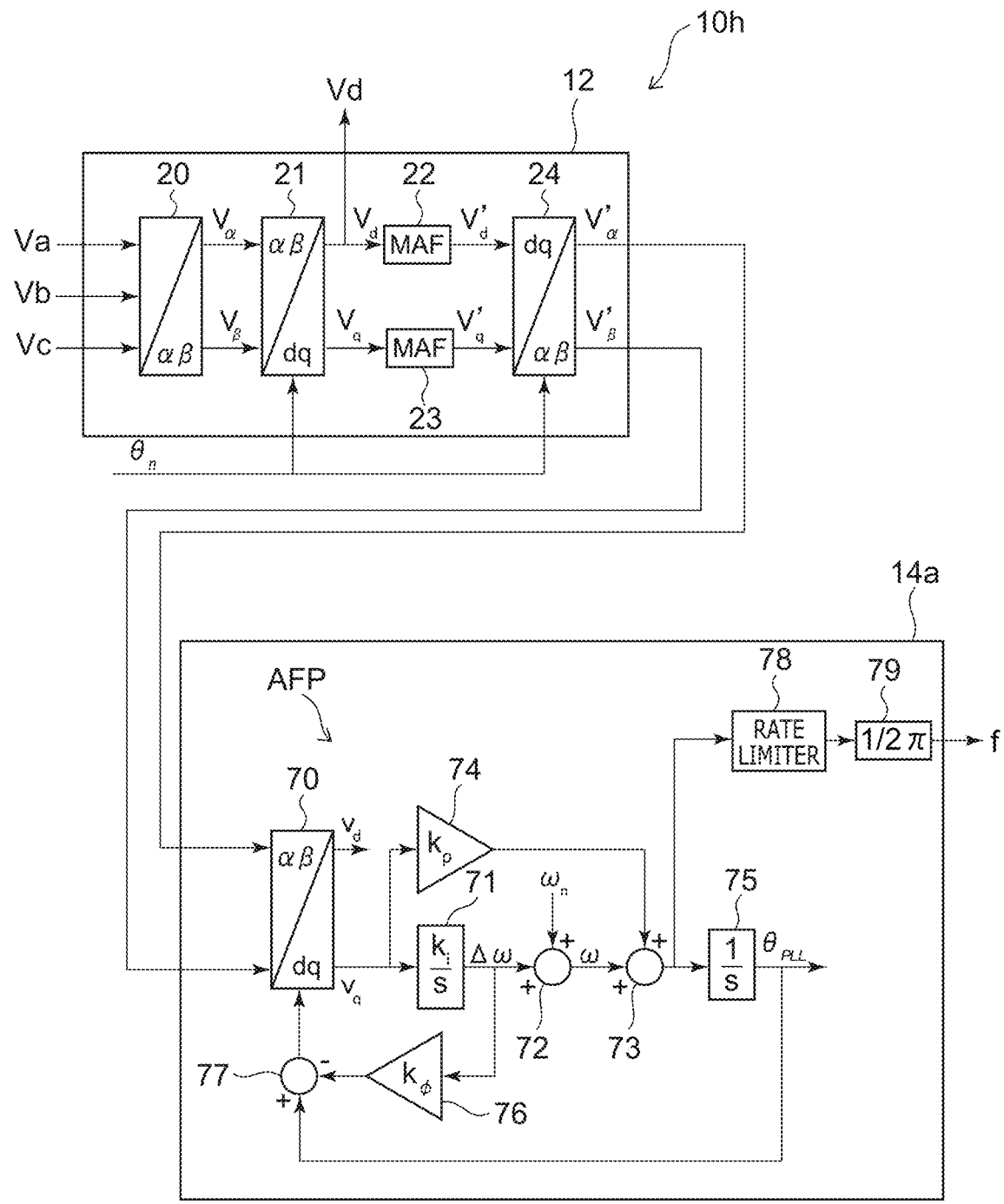
FIG. 11 is a block diagram schematically illustrating a system frequency detector according to an eighth embodiment.

FIG. 11 is a block diagram schematically illustrating a system frequency detector according to an eighth embodiment. In the system frequency detector 10h as illustrated in FIG. 11, the angular frequency calculator AFP of a frequency calculator 14a includes a rotating coordinate converter 70, an integrator 71, adders 72 and 73, an arithmetic unit 74, an integrator 75, an arithmetic unit 76, and a subtractor 77.

The two-phase voltage signals $V_\alpha'$ and $V_\beta'$ are input to the rotating coordinate converter 70, and the synchronous phase $\theta_{PLL}$ is input to the rotating coordinate converter 70. The rotating coordinate converter 70 uses a so-called dq transformation (a Park transformation) to perform a rotating coordinate transformation of the voltage signals $V_\alpha'$ and $V_\beta'$ of the orthogonal two-axis coordinates into voltage signals $v_d$ and $v_q$ of a coordinate system (dq coordinates) synchronized with the synchronous phase $\theta_{PLL}$.

The integrator 71 calculates the command value $\Delta\omega$ of the angular frequency for setting the voltage signal $v_q$ of the q-axis component of the three-phase alternating current power of the power system to zero by multiplying the voltage signal $v_q$ by the integral gain $K_I$ and by integrating the multiplication result. The integrator 71 inputs the calculated command value $\Delta\omega$ to the adder 72.

The command value $\Delta\omega$ of the angular frequency calculated by the integrator 71 is input to the adder 72, and the nominal angular frequency $\omega_n$ of the power system is input to the adder 72. The adder 72 calculates the angular frequency $\omega$ of the power system by adding the command value $\Delta\omega$ of the angular frequency and the nominal angular frequency $\omega_n$ of the power system. The adder 72 inputs the calculated angular frequency $\omega$ to the adder 73.

The arithmetic unit 74 multiplies the voltage signal $v_q$ by the proportional gain $K_P$ and inputs the multiplication result to the adder 73.

The adder 73 corrects the angular frequency $\omega$ by adding the angular frequency $\omega$ calculated by the adder 72 and the multiplication result of the arithmetic unit 74.

The integrator 75 calculates the synchronous phase $\theta_{PLL}$ that is synchronized with the voltage signals $V_\alpha'$ and $V_\beta'$ after the two-phase conversion from the angular frequency $\omega$ by integrating the angular frequency $\omega$ after being corrected by the adder 73. The integrator 75 inputs the calculated synchronous phase $\theta_{PLL}$ to the subtractor 77.

The arithmetic unit 76 calculates the correction value by multiplying the integration result of the integrator 71 by the constant $K_\phi$. The arithmetic unit 76 inputs the calculated correction value to the subtractor 77.

The subtractor 77 corrects the synchronous phase $\theta_{PLL}$ by subtracting the correction value from the synchronous phase $\theta_{PLL}$. The subtractor 77 inputs the synchronous phase $\theta_{PLL}$ after the correction to the rotating coordinate converter 70. As described above, the rotating coordinate converter 70 calculates the voltage signals $v_d$ and $v_q$ based on the synchronous phase $\theta_{PLL}$ after the correction.

Thus, the angular frequency calculator AFP of the frequency calculator 14a synchronizes the synchronous phase $\theta_{PLL}$ with the phase $\theta_n$ of the power system by feeding back the detected synchronous phase $\theta_{PLL}$ to the rotating coordinate converter 70 and by detecting the synchronous phase $\theta_{PLL}$ to cause the voltage signal $v_q$ of the q-axis component of the three-phase alternating current power of the power system to be zero. Based on the angular frequency $\omega$, the angular frequency calculator AFP of the frequency calculator 14a generates the voltage signal $v_q$ of the q-axis component of the three-phase alternating current power of the power system and calculates the angular frequency $\omega$ to cause the voltage signal $v_q$ of the reactive component to be zero by detecting the synchronous phase $\theta_{PLL}$ synchronized with the two-phase voltage signals $V_\alpha'$ and $V_\beta'$ after calculating the moving averages and by performing a rotating coordinate transformation of the two-phase voltage signals $V_\alpha'$ and $V_\beta'$ after calculating the moving averages. For example, the configuration of the PLL of the angular frequency calculator AFP (the frequency calculator 14a) of the example may be called an EPMAFPLL (Enhanced Pre-filtering Moving Average Filter PLL).

Also, the frequency calculator 14a calculates the system frequency f of the power system from the calculated angular frequency $\omega$. The frequency calculator 14a further includes a rate limiter 78 and an arithmetic unit 79. The adder 73 inputs the calculated angular frequency $\omega$ to the integrator 75 and inputs the angular frequency $\omega$ to the rate limiter 78.

The rate limiter 78 limits a change of the angular frequency $\omega$ equal to or greater than a prescribed change rate. The rate limiter 78 inputs, to the arithmetic unit 79, the angular frequency $\omega$ that is less than the prescribed change rate or the angular frequency $\omega$ after being limited to the prescribed change rate. The arithmetic unit 79 calculates the system frequency f from the angular frequency $\omega$ by multiplying the angular frequency $\omega$ by $\frac{1}{2}\pi$. As described in the embodiments described above, the rate limiter 78 may be provided after the arithmetic unit 79.

Thus, the configuration of the frequency calculator may be an EPMAFPLL configuration or may be an $\alpha\beta$EPMAFPLL configuration. However, the configuration of the frequency calculator is not limited to these configurations. The configuration of the frequency calculator may be, for example, a PMAFPLL (Pre-filtering Moving Average Filter PLL) configuration in which the arithmetic unit 76 and the subtractor 77 are omitted from an EPMAFPLL configuration and the synchronous phase $\theta_{PLL}$ calculated by the integrator 75 is fed back to the rotating coordinate converter 70 as-is. Or, the configuration of the frequency calculator may be an EPMAFPLL Type-2 configuration, etc., in which the integration result of the integrator 71 is multiplied by the constant $K_\phi$, and the calculated correction value is fed back to the inverse converter 24 and the rotating coordinate converter 21 of the orthogonal coordinate signal generator 12.

Also, an Anti reset wind up feedback control may be added to the EPMAFPLL configuration illustrated in FIG. 11. In such a case, for example, it is sufficient for the integrator 71 to be divided into an arithmetic unit multiplying the integral gain $K_I$ by the voltage signal $v_q$ and an integrator integrating the multiplication result similarly to the example illustrated in FIG. 4, etc., and for the output-input difference of the rate limiter 78 to be fed back to the calculation of the proportional-integral control by providing a subtractor between the arithmetic unit and the integrator.

Hereinabove, embodiments of the invention are described with reference to specific examples. However, the embodiments of the invention are not limited to these specific examples. For example, one skilled in the art may similarly practice the invention by appropriately selecting specific configurations of components included in the system frequency detectors 10 and 10a to 10h from known art, and such practice is within the scope of the invention to the extent that similar effects can be obtained.

Also, combinations of any two or more components of the specific examples within the extent of technical feasibility also are within the scope of the invention to the extent that the spirit of the invention is included.

Also, all system frequency detectors practicable by an appropriate design modification by one skilled in the art based on the system frequency detectors 10 and 10a to 10h described above as embodiments of the invention also are within the scope of the invention to the extent that the spirit of the invention is included.

Also, various modifications and alterations within the spirit of the invention will be readily apparent to those skilled in the art, and all such modifications and alterations should be seen as being within the scope of the invention.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A system frequency detector, comprising:
an orthogonal coordinate signal generator generating an orthogonal two-phase voltage signal from a three-phase voltage signal of three-phase alternating current power of a power system by converting the three-phase voltage signal into a two-phase voltage signal orthogonal to the three-phase voltage signal, converting the two-phase voltage signal into a voltage signal of a rotating coordinate system, calculating a moving average of the voltage signal of the rotating coordinate system, and performing an inverse transformation of the voltage signal of the rotating coordinate system after calculating the moving average; and
frequency calculation circuitry including
an angular frequency calculator calculating an angular frequency of the power system based on the two-phase voltage signal after calculating the moving average generated by the orthogonal coordinate signal generator, and
an arithmetic calculator calculating a system frequency of the power system from the angular frequency by multiplying the angular frequency by $1/2\pi$, the system frequency being used in a power conversion device in which a distributed power source is connected to the power system,
the frequency calculation circuitry further including a rate limiter provided in series with the arithmetic calculator, the rate limiter limiting a change of the system frequency equal to or greater than a prescribed change rate.

2. The system frequency detector according to claim 1, wherein
the angular frequency calculator calculates the angular frequency by performing a proportional-integral control based on the two-phase voltage signal, and
the frequency calculation circuitry feeds back an output-input difference of the rate limiter to the calculation of the proportional-integral control of the angular frequency calculator.

3. The system frequency detector according to claim 2, wherein
the frequency calculation circuitry further includes:
a saturation limiter provided in parallel with the rate limiter, the saturation limiter limiting a change of the system frequency equal to or greater than a prescribed value with respect to a nominal system frequency; and
a switching circuit selectively switching between a first state in which the rate limiter is used and a second state in which the saturation limiter is used,
the orthogonal coordinate signal generator generates a voltage signal of an active component of the three-phase alternating current power of the power system by converting the two-phase voltage signal into a voltage signal of a rotating coordinate system, and
the switching circuit selects the first state when an absolute value of a differential of the voltage signal of the active component is less than a prescribed value, and selects the second state when the absolute value of the differential of the voltage signal of the active component is equal to or greater than the prescribed value.

4. The system frequency detector according to claim 2, wherein
the frequency calculation circuitry further includes:
a slow rate limiter provided in parallel with the rate limiter, the slow rate limiter limiting a change of the system frequency at a lower change rate than a change rate of the rate limiter; and
a switching circuit selectively switching between a first state in which the rate limiter is used and a second state in which the slow rate limiter is used,
the orthogonal coordinate signal generator generates a voltage signal of an active component of the three-phase alternating current power of the power system by converting the two-phase voltage signal into a voltage signal of a rotating coordinate system, and
the switching circuit selects the first state when an absolute value of a differential of the voltage signal of the active component is less than a prescribed value, and selects the second state when the absolute value of the differential of the voltage signal of the active component is equal to or greater than the prescribed value.

5. The system frequency detector according to claim 2, wherein
the frequency calculation circuitry further includes:
a saturation limiter provided in series with the rate limiter, the saturation limiter limiting a change of the system frequency equal to or greater than a prescribed value with respect to a nominal system frequency; and
a switching circuit selectively switching between a first state in which only the rate limiter is used and a second state in which a series-connected calculator of the rate limiter and the saturation limiter is used,
the orthogonal coordinate signal generator generates a voltage signal of an active component of the three-phase alternating current power of the power system by converting the two-phase voltage signal into a voltage signal of a rotating coordinate system, and
the switching circuit selects the first state when an absolute value of a differential of the voltage signal of the active component is less than a prescribed value, and selects the second state when the absolute value of the differential of the voltage signal of the active component is equal to or greater than the prescribed value.

6. The system frequency detector according to claim 2, wherein
the frequency calculation circuitry further includes:
a sample-and-hold circuit provided in parallel with the rate limiter, the sample-and-hold circuit including
a sample mode of causing an output signal to track an input signal, and
a hold mode of holding the output signal to be substantially constant at a value of a prescribed timing; and
a switching circuit selectively switching between a first state in which the rate limiter is used and a second state in which the sample-and-hold circuit is used,
the orthogonal coordinate signal generator generates a voltage signal of an active component of the three-phase alternating current power of the power system by converting the two-phase voltage signal into a voltage signal of a rotating coordinate system, and
the switching circuit selects the first state and causes the sample-and-hold circuit to operate in the sample mode when an absolute value of a differential of the voltage signal of the active component is less than a prescribed value, and selects the second state and switches the sample-and-hold circuit from the sample mode to the hold mode when the absolute value of the differential of the voltage signal of the active component is equal to or greater than the prescribed value.

7. The system frequency detector according to claim 1, wherein
the frequency calculation circuitry further includes a low-pass filter provided in series with the arithmetic calculator, the low-pass filter suppressing a high frequency component of the system frequency.

8. The system frequency detector according to claim 1, wherein
based on the angular frequency, the angular frequency calculator detects a synchronous phase synchronized with the two-phase voltage signal after calculating the moving average, calculates an error phase between the synchronous phase and a nominal phase of the power system, and calculates the angular frequency to cause the error phase to be zero.

9. The system frequency detector according to claim 1, wherein
based on the angular frequency, the angular frequency calculator detects a synchronous phase synchronized with the two-phase voltage signal after calculating the moving average, generates a voltage signal of a reactive component of the three-phase alternating current power of the power system by performing a rotating coordinate transformation of the two-phase voltage signal after calculating the moving average, and calculates the angular frequency to cause the voltage signal of the reactive component to be zero.

10. The system frequency detector according to claim 1, wherein the distributed power source includes at least one of a solar power generator or a wind power generator.

11. A power conversion system, comprising:
a system frequency detector to detect a system frequency of a power system being connected to a distributed power source; and
a power convertor to operate power conversion based on the system frequency of the power system,
wherein the system frequency detector includes an orthogonal coordinate signal generator generating an orthogonal two-phase voltage signal from a three-phase voltage signal of three-phase alternating current power of the power system by converting the three-phase voltage signal into a two-phase voltage signal orthogonal to the three-phase voltage signal, converting the two-phase voltage signal into a voltage signal of a rotating coordinate system, calculating a moving average of the voltage signal of the rotating coordinate system, and performing an inverse transformation of the voltage signal of the rotating coordinate system after calculating the moving average,
wherein the system frequency detector includes frequency calculation circuitry including an angular frequency calculator, an arithmetic calculator, and a rate limiter,
wherein the angular frequency calculator calculating an angular frequency of the power system based on the two-phase voltage signal after calculating the moving average generated by the orthogonal coordinate signal generator, and
wherein the arithmetic calculator calculating the system frequency of the power system from the angular frequency by multiplying the angular frequency by $1/2\pi$,
wherein the rate limiter is provided in series with the arithmetic calculator, the rate limiter limiting a change of the system frequency equal to or greater than a prescribed change rate.

12. The power conversion system according to claim 11, wherein
the angular frequency calculator calculates the angular frequency by performing a proportional-integral control based on the two-phase voltage signal, and
the frequency calculation circuitry feeds back an output-input difference of the rate limiter to the calculation of the proportional-integral control of the angular frequency calculator.

13. The power conversion system according to claim 12, wherein
the frequency calculation circuitry further includes:
a saturation limiter provided in parallel with the rate limiter, the saturation limiter limiting a change of the system frequency equal to or greater than a prescribed value with respect to a nominal system frequency; and
a switching circuit selectively switching between a first state in which the rate limiter is used and a second state in which the saturation limiter is used,
the orthogonal coordinate signal generator generates a voltage signal of an active component of the three-phase alternating current power of the power system by converting the two-phase voltage signal into a voltage signal of a rotating coordinate system, and
the switching circuit selects the first state when an absolute value of a differential of the voltage signal of the active component is less than a prescribed value, and selects the second state when the absolute value of the differential of the voltage signal of the active component is equal to or greater than the prescribed value.

14. The power conversion system according to claim 12, wherein
the frequency calculation circuitry further includes:
a slow rate limiter provided in parallel with the rate limiter, the slow rate limiter limiting a change of the system frequency at a lower change rate than a change rate of the rate limiter; and
a switching circuit selectively switching between a first state in which the rate limiter is used and a second state in which the slow rate limiter is used,
the orthogonal coordinate signal generator generates a voltage signal of an active component of the three-phase alternating current power of the power system by converting the two-phase voltage signal into a voltage signal of a rotating coordinate system, and
the switching circuit selects the first state when an absolute value of a differential of the voltage signal of the active component is less than a prescribed value, and selects the second state when the absolute value of the differential of the voltage signal of the active component is equal to or greater than the prescribed value.

15. The power conversion system according to claim 12, wherein
the frequency calculation circuitry further includes:
a saturation limiter provided in series with the rate limiter, the saturation limiter limiting a change of the system frequency equal to or greater than a prescribed value with respect to a nominal system frequency; and
a switching circuit selectively switching between a first state in which only the rate limiter is used and a second state in which a series-connected calculator of the rate limiter and the saturation limiter is used, the orthogonal coordinate signal generator generates a voltage signal of an active component of the three-phase alternating current power of the power system by converting the two-phase voltage signal into a voltage signal of a rotating coordinate system, and the switching circuit selects the first state when an absolute value of a differential of the voltage signal of the active component is less than a prescribed value, and selects the second state when the absolute value of the differential of the voltage signal of the active component is equal to or greater than the prescribed value.

16. The power conversion system according to claim 12, wherein the frequency calculation circuitry further includes:

a sample-and-hold circuit provided in parallel with the rate limiter, the sample-and-hold circuit including a sample mode of causing an output signal to track an input signal, and a hold mode of holding the output signal to be substantially constant at a value of a prescribed timing; and a switching circuit selectively switching between a first state in which the rate limiter is used and a second state in which the sample-and-hold circuit is used, the orthogonal coordinate signal generator generates a voltage signal of an active component of the three-phase alternating current power of the power system by converting the two-phase voltage signal into a voltage signal of a rotating coordinate system, and the switching circuit selects the first state and causes the sample-and-hold circuit to operate in the sample mode when an absolute value of a differential of the voltage signal of the active component is less than a prescribed value, and selects the second state and switches the sample-and-hold circuit from the sample mode to the hold mode when the absolute value of the differential of the voltage signal of the active component is equal to or greater than the prescribed value.

17. The power conversion system according to claim 11, wherein the frequency calculation circuitry further includes a low-pass filter provided in series with the arithmetic calculator, the low-pass filter suppressing a high frequency component of the system frequency.

18. The power conversion system according to claim 11, wherein based on the angular frequency, the angular frequency calculator detects a synchronous phase synchronized with the two-phase voltage signal after calculating the moving average, calculates an error phase between the synchronous phase and a nominal phase of the power system, and calculates the angular frequency to cause the error phase to be zero.

19. The power conversion system according to claim 11, wherein based on the angular frequency, the angular frequency calculator detects a synchronous phase synchronized with the two-phase voltage signal after calculating the moving average, generates a voltage signal of a reactive component of the three-phase alternating current power of the power system by performing a rotating coordinate transformation of the two-phase voltage signal after calculating the moving average, and calculates the angular frequency to cause the voltage signal of the reactive component to be zero.

20. The power conversion system according to claim 11, wherein the distributed power source includes at least one of a solar power generator or a wind power generator.

* * * * *